United States Patent [19]
Hashimoto et al.

[11] Patent Number: 6,043,686
[45] Date of Patent: Mar. 28, 2000

[54] APPARATUS AND METHOD FOR TRANSISTOR ELEMENT REDUCTION IN CIRCUITS COMPARING SERIAL DATA SIGNALS

[75] Inventors: Masashi Hashimoto, Richardson, Tex.; Anjana Ghosh, Bangalore, India

[73] Assignee: Texas Instruments Incorporated, Dallas, Tex.

[21] Appl. No.: 08/861,509

[22] Filed: May 22, 1997

Related U.S. Application Data

[60] Provisional application No. 60/018,762, May 31, 1996.

[51] Int. Cl.[7] ............................................. G06F 7/02
[52] U.S. Cl. ........................... 327/73; 327/73; 326/52; 326/53; 326/113; 340/146.2
[58] Field of Search .................. 326/52, 53, 113; 327/72, 73; 340/146.2

[56] References Cited

U.S. PATENT DOCUMENTS

| | | | |
|---|---|---|---|
| 4,585,952 | 4/1986 | Yamamoto | 327/73 |
| 5,334,888 | 8/1994 | Bodas | 326/52 |
| 5,414,305 | 5/1995 | Nakamura et al. | 327/73 |
| 5,640,115 | 6/1997 | Halepete et al. | 327/73 |

*Primary Examiner*—Margaret R. Wambach
*Attorney, Agent, or Firm*—Robby T. Holland; Carlton H. Hoel; Richard L. Donaldson

[57] ABSTRACT

In the design of an integrated circuit for comparing serial data signals, the number of transistor elements can be reduced by implementing the comparison gate (12) based on the associated truth table rather than by using a general comparison gate component. Using this method, an exclusive OR gate (22) can be implemented using two transistor elements (221, 222), an exclusive NOR gate (52) can be implemented using two transistor elements (521, 522), an AND gate (62) can be implemented using a single transistor element (621), and an OR gate (72) can be implemented using a single transistor element (721). The reduced number of elements used to implement the comparison gates can provide a transistor element saving in the associated circuit.

13 Claims, 7 Drawing Sheets

APPARATUS AND METHOD FOR TRANSISTOR ELEMENT REDUCTION IN CIRCUITS COMPARING SERIAL DATA SIGNALS

This application claims priority under 35 USC 119(e)(1) of provisional application Ser. No. 60/018,762, filed May 31, 1996.

BACKGROUND OF THE INVENTION

1. Field of the Invention

This invention relates generally to integrated semiconductor circuits and, more particularly, to comparison circuits which compare serial data signals. The invention describes a method for reducing the number of transistor elements implementing the comparison circuits.

2. Description of the Related Art

In the implementation of integrated circuits wherein a comparison of serial data signals is required, the comparison components are typically implemented as exclusive OR logic gates, exclusive NOR logic gates, AND logic gates, OR logic gates, etc. In most applications, the number of transistors required to implement each of these basic components provides an semiconductor element overhead or burden for the circuit design layout. In the circuit implementations that require comparison between serial data signals, such as in counters, adders, and parity checkers, registers are needed for storing data. Initialization circuits are required in addition to the basic gates or components performing the comparison operation. Any effort to reduce the number of transistor elements in the integrated circuit must address the problem of the number of transistors required to implement the comparison gates and the associated registers.

Referring to prior art FIG. 1, a typical comparison circuit is shown. The circuit includes a pass gate 11 to which a NEW DATA signal is applied. The NEW DATA signal and a PCNT signal are applied to the initialization circuit 14. A CLK signal is applied to register 13 and to pass gate 11. An output signal from pass gate 11 and an output signal B(T-1) is applied to comparison gate 12. An output signal from the initialization circuit 14 is applied to register 13 and is the circuit output signal B(T). In operation, the comparison circuit compares a signal B(T-1), derived during the previous clock cycle, with a NEW DATA signal to provide the current output signal B(T). The initialization circuit provides that on the first comparison operation, when no B(T-1) signal is available, the NEW DATA signal is stored in the register.

Referring to prior art FIG. 2, the circuit shown in FIG. 1 has the comparison circuit 12 specified as an exclusive OR gate 22. Both a B(T-1) and a B(T-1)_{i.e., the complement of the B(T-1) signal} are applied to the exclusive OR gate 22 in this implementation.

Referring to prior art FIG. 3, an implementation of the circuits associated with the exclusive OR gate 22 is shown. With respect to the register 13, the CLK signal is applied to an input terminal of inverting amplifier 131, to a gate terminal of a n-channel field effect transistor 136, to a p-channel control terminal of passgate transistor 134, and to a p-channel control terminal of passgate transistor 137. The output terminal of inverting amplifier provides a CLK_ signal to pass gate 11 and is coupled to an n-channel control terminal of passgate transistor 134 and to an n-channel terminal to passgate transistor 137. A drain terminal of transistor 136 is coupled to a first signal terminal of passgate 134 and to an input terminal of inverting amplifier 133. An output terminal of inverting amplifier 133 is coupled to an input terminal of inverting amplifier 132 and provides a B(T-1) signal to the exclusive OR gate 22. The output terminal of inverting amplifier is coupled to a source terminal of transistor 136 and provides the B(T-1)_ signal to the exclusive OR gate 22. The B(T) signal is applied to an input terminal of inverting amplifier 138 and to a first signal terminal of passgate transistor 137. An output terminal of inverting amplifier 138 is coupled to an input terminal of inverting amplifier 135 and to second signal terminal of passgate transistor 134. The output terminal of inverting amplifier 135 is coupled to a second signal terminal of passgate 137. With respect to the pass gate 11, a NEW DATA signal is applied to a first source-drain terminal of p-channel field effect transistor 111. The CLK_ signal from register 13 is coupled to a gate terminal of transistor 111 and to a gate terminal of n-channel field effect transistor 112. The second source drain terminal of transistor 111 is coupled through source drain terminal of transistor 112 to the ground potential and provides an A signal to the exclusive OR gate 22. With respect to the initialization circuit 14, the output signal of exclusive OR gate 22 is applied to a first signal terminal of passgate transistor 141. A PCNT signal is applied to a p-channel control terminal of passgate transistor 142, to an input terminal of inverting amplifier 143 and to an n-channel control terminal of passgate transistor 141. The output terminal of inverting amplifier 143 is coupled to an n-channel control terminal of passgate transistor 142 and to a p-channel control terminal of passgate transistor 141. A NEW DATA signal is applied to a first signal terminal of pass gate transistor 142. The second signal terminal of passgate transistor 141 and a second signal terminal of passgate transistor 142 provide the B(T) signal.

Because increased complexity and miniaturization has resulted in competition for space in an integrated circuit, a need has been felt for apparatus and an associated technique for reducing the number of implementing transistors in the comparison components and associated circuits.

SUMMARY OF THE INVENTION

The aforementioned and other features are accomplished, according to the present invention, by identifying the minimum number of transistors required for the comparison circuit to implement the truth table, i.e., to implement the comparison circuit functionality, rather than implement the comparison circuit using a standard logic gate or component. For example, the exclusive OR gate, when used in the comparison of serial data signals can be implemented using two transistors. Similarly, in the comparison of serial data, an exclusive NOR gate can be implemented with two transistors, while an OR gate and an AND gate can be implemented with a single transistor. The reduction in the number of transistors of a comparison circuit in this application can result in a simplification of the associated components.

These and other features of the present invention will be understood upon the reading of the Specification in conjunction with the Figures.

DESCRIPTION OF THE PREFERRED EMBODIMENT(S)

1. Detailed Description of the Drawings

Figure 4:
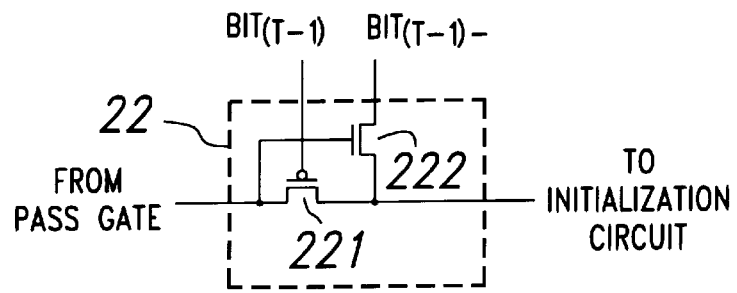
FIG. 4 is an implementation of an exclusive OR gate according to the present invention.
Figure 5:
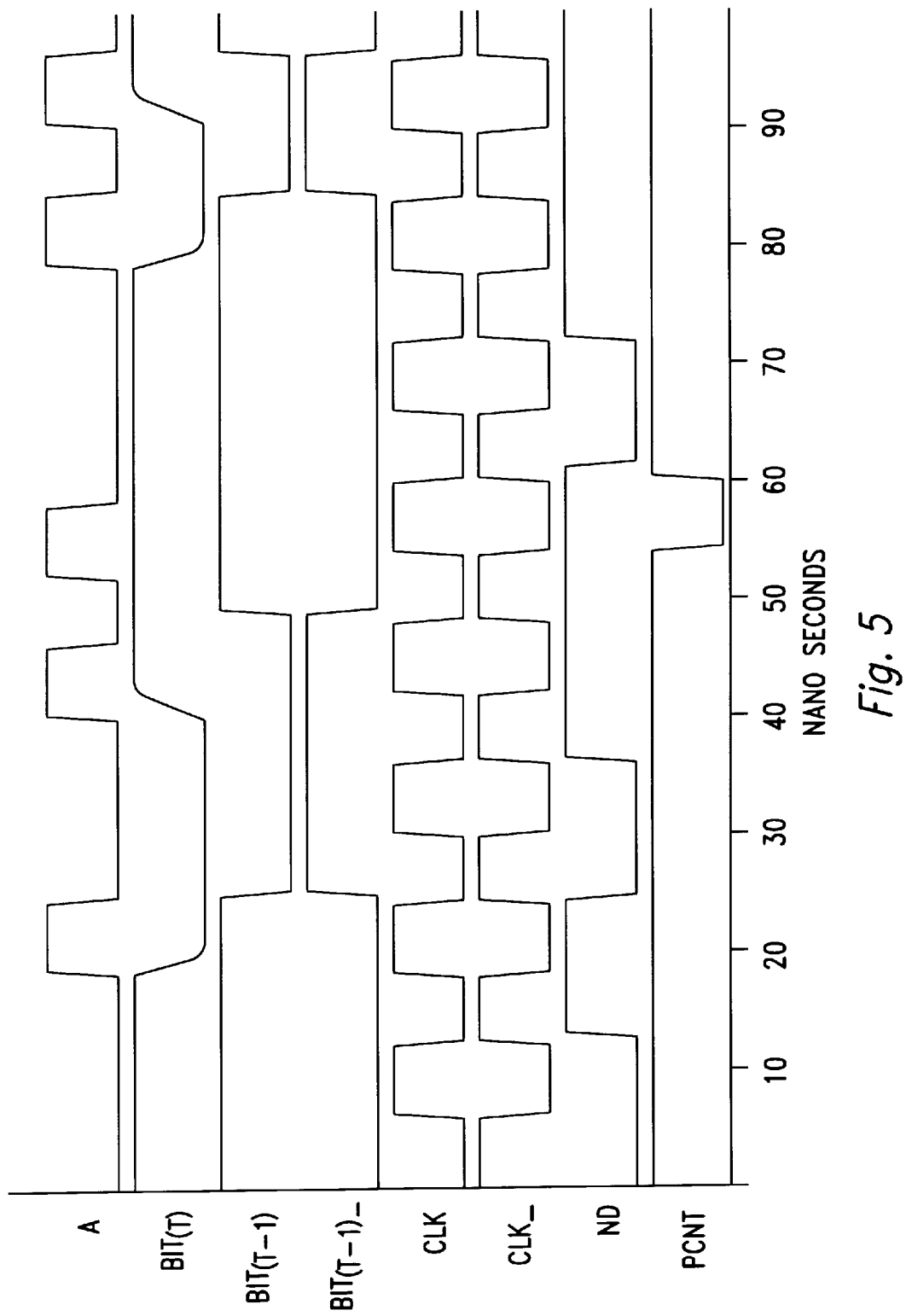
FIG. 5 is a timing diagram illustrating the relationship between selected voltages in the exclusive OR circuit of FIG. 4 (and FIG. 3).

Referring to FIG. 4, an implementation of an exclusive OR gate according to the present invention is shown. The signal from passgate 11 is applied a first source-drain terminal of p-channel field effect transistor 221 and to a gate terminal of n-channel field effect transistor 222. The gate terminal of transistor 221 has the B(T-1) signal applied thereto. A first source-drain terminal of transistor 222 has the B(T-1)_ signal applied thereto. The second source-drain terminal of transistor 221 is coupled to a second source drain terminal of transistor 222 and applies the B(T) signal to the initialization circuit 14. The relationship of various signals for the exclusive OR gate comparison circuit is shown as a function of time in FIG. 5.

Figure 1:
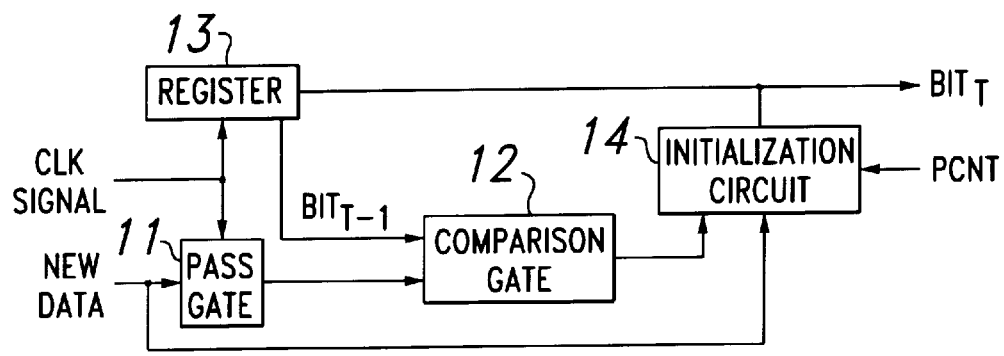
FIG. 1 is a prior art schematic block diagram of a circuit for comparison of serial data signals.
Figure 2:
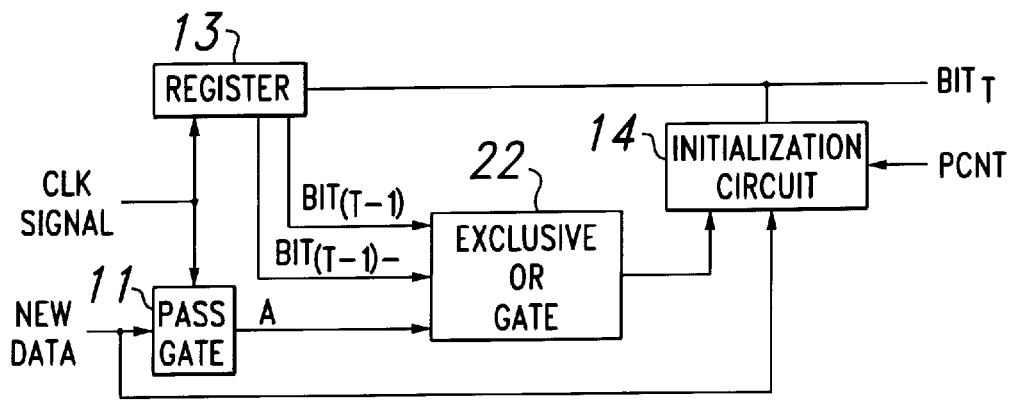
FIG. 2 is a prior art schematic block diagram of a circuit for an exclusive OR functional comparison of serial data signals.
Figure 3:
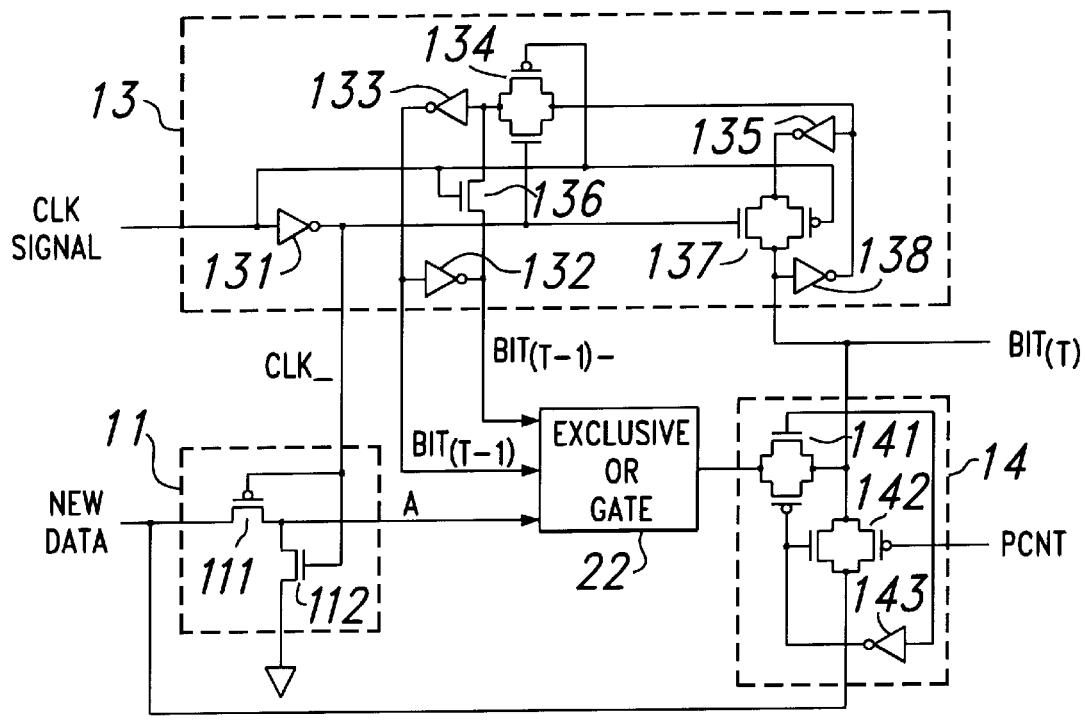
FIG. 3 is a schematic circuit diagram of circuits associated with the exclusive OR gate of FIG. 2.
Figure 6:
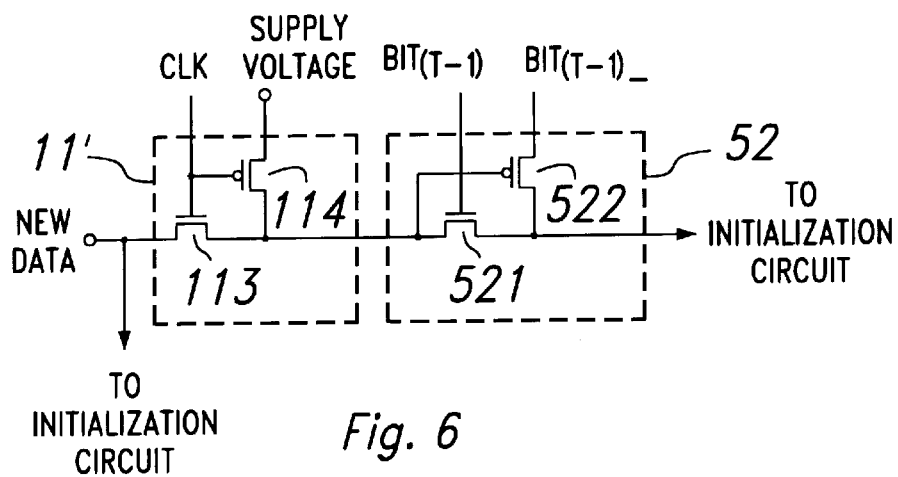
FIG. 6 is an implementation of an exclusive NOR gate according to the present invention.
Figure 7:
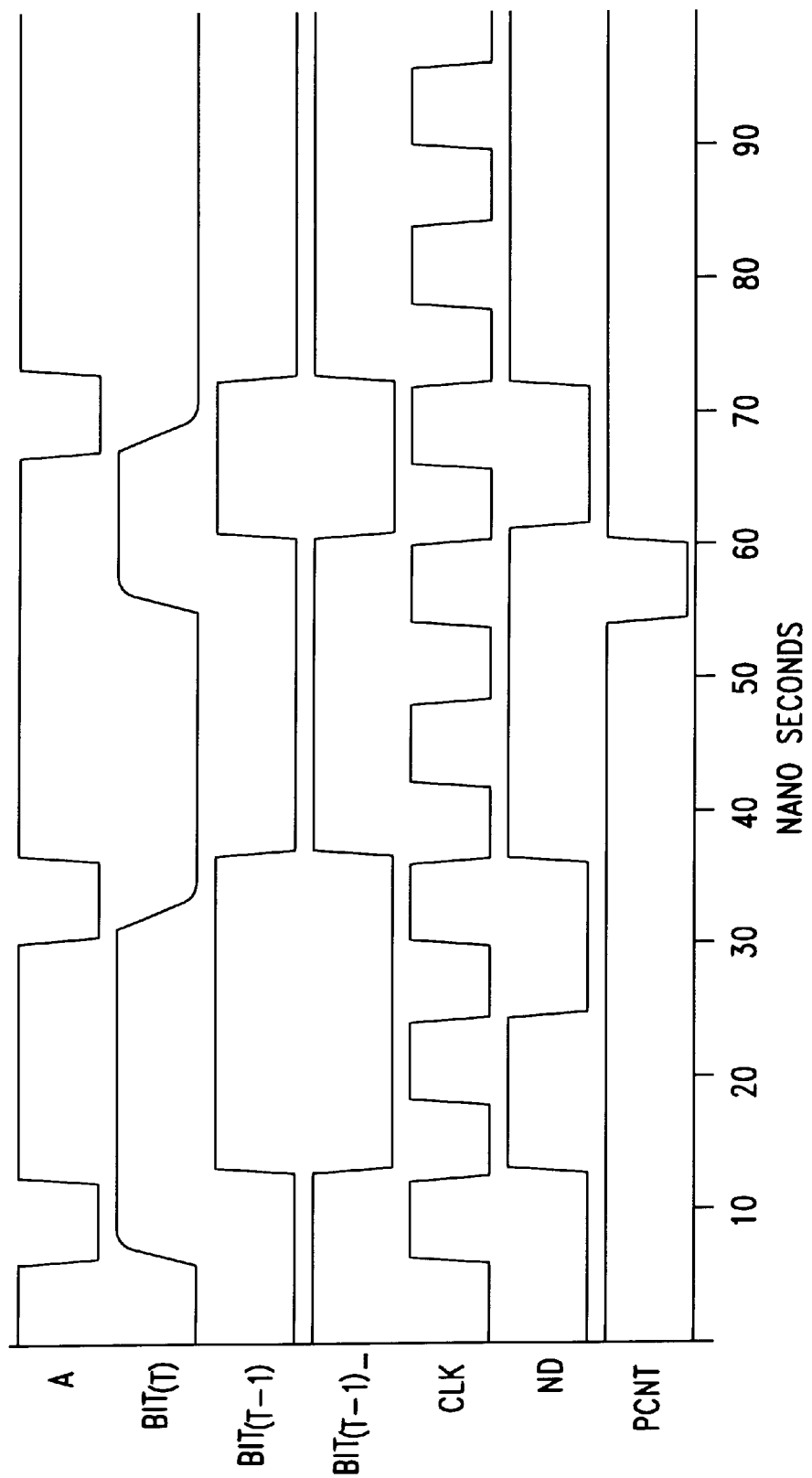
FIG. 7 is a timing diagram illustrating the relationship between selected voltages in the exclusive NOR comparison circuit of FIG. 6.

Referring to FIG. 6, the implementation of an exclusive NOR gate according to the present invention is shown. A signal transmitted by the pass gate 11' is coupled to a first source drain terminal of n-channel field effect transistor 521 and to a gate terminal of p-channel field effect transistor 522. The B(T-1) signa is applied to the gate terminal of transistor 521, while the B(T-1)_ signal is applied to a first source-drain terminal of transistor 522. The second source-drain terminal of transistor 521 is coupled to the second source-drain terminal of transistor 522 and provides the B(T) signal to the initialization circuit. For the exclusive NOR gate implementation, the pass gate 11' has a different implementation as compared to the implementation shown in FIG. 3. For the exclusive NOR gate, pass gate 11' has a NEW DATA signal applied to a first source-drain terminal of n-channel field effect transistor 113. A CLK signal is applied to a gate terminal of transistor 113 and to a gate terminal of p-channel field effect transistor 114. A first source drain terminal of transistor 114 is coupled to a supply voltage, while a second source-drain terminal of transistor 114 is coupled to a second source-drain terminal of transistor 113 and provides the NEW DATA input signal to exclusive NOR gate 52. The relationship of various signals for the exclusive NOR gate comparison circuit is shown as a function of time in FIG. 7.

Figure 8:
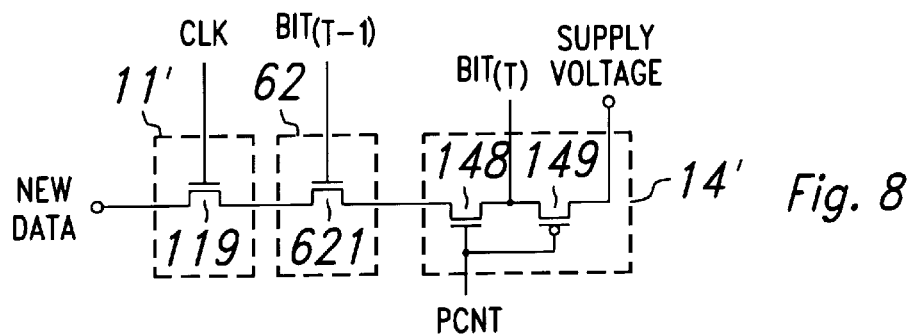
FIG. 8 is an implementation of an AND gate according to the present invention.
Figure 9:
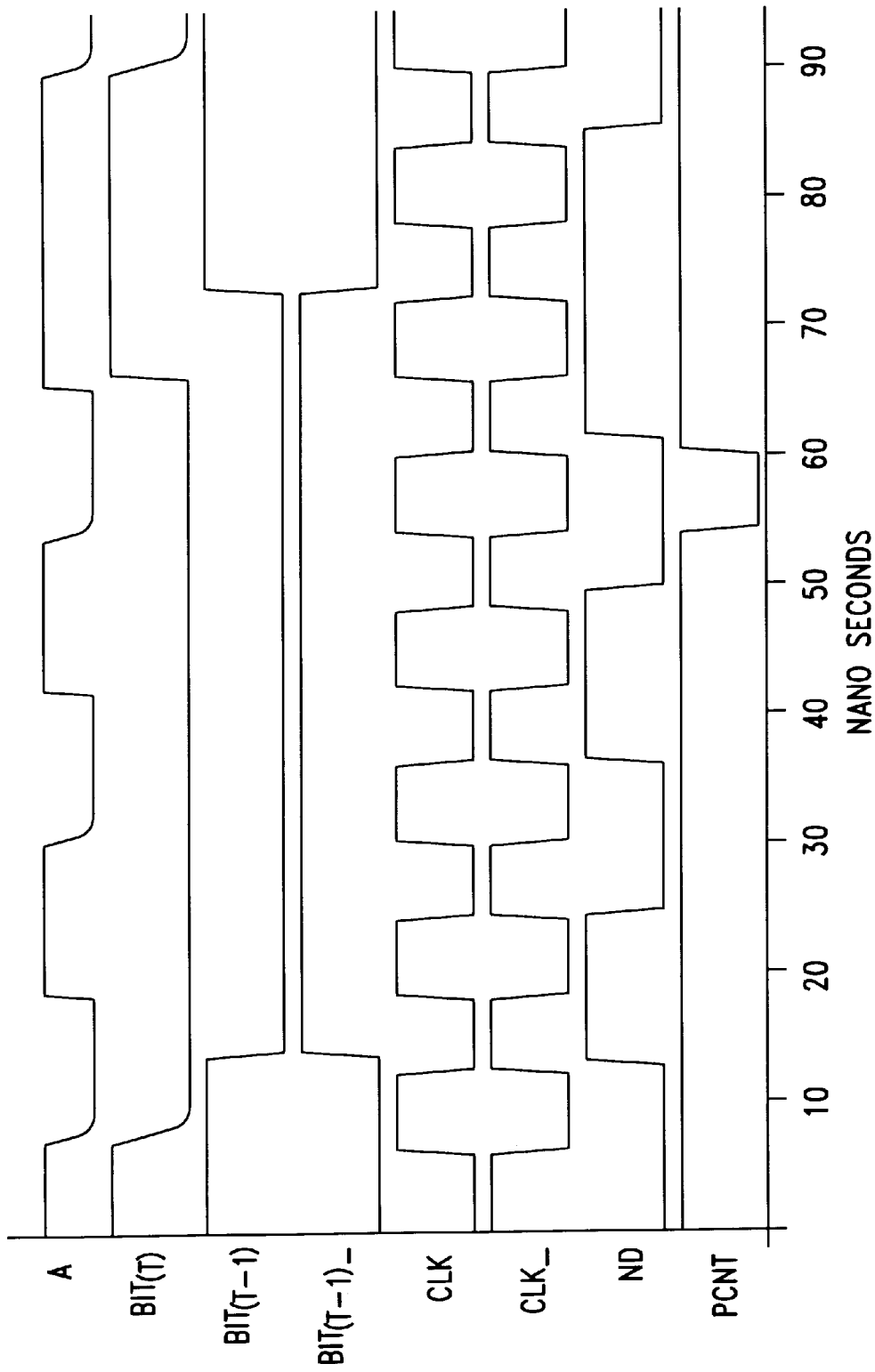
FIG. 9 is a timing diagram illustrating the relationship between selected voltages in the AND comparison circuit of FIG. 8.

Referring to FIG. 8, an implementation of an AND gate according to the present invention is shown. The AND gate has a signal from the pass gate 11' applied to a first source-drain terminal of n-channel field effect transistor 621. The gate terminal of transistor 621 has the B(T-1) signal applied thereto. The second source-drain terminal of transistor 621 provide the signal for the initialization circuit 14'. The pass gate 11' for the AND gate has a different implementation as compared to the pass gate 11 for the exclusive OR circuit of FIG. 3. The pass gate circuit 11' of FIG. 8 is an n-channel field effect transistor 119 having the NEW DATA signal applied to a first source-drain terminal, providing a signal to the OR gate 62 by the second source-drain terminal of transistor 119, and having a CLK signal applied to the gate terminal of transistor 119. Similarly, the initialization circuit 14' required for this implementation of the AND gate is different from the implementation of the initialization circuit for the exclusive OR gate of FIG. 3. In the implementation of the initialization circuit 14' of FIG. 8, the output signal from AND gate 62 is applied to a first source drain terminal of n-channel field effect transistor 148. The second source drain terminal of transistor 148 is coupled to a first source drain terminal of p-channel field effect transistor 149 and provides the B(T) signal. The PCNT signal is applied to the gate terminal of transistor 148 and to the gate terminal of transistor 149. The second source-drain terminal of transistor 149 is coupled to a supply voltage. The relationship of various signals for the AND gate comparison circuit is shown as a function of time in FIG. 9.

Figure 10:
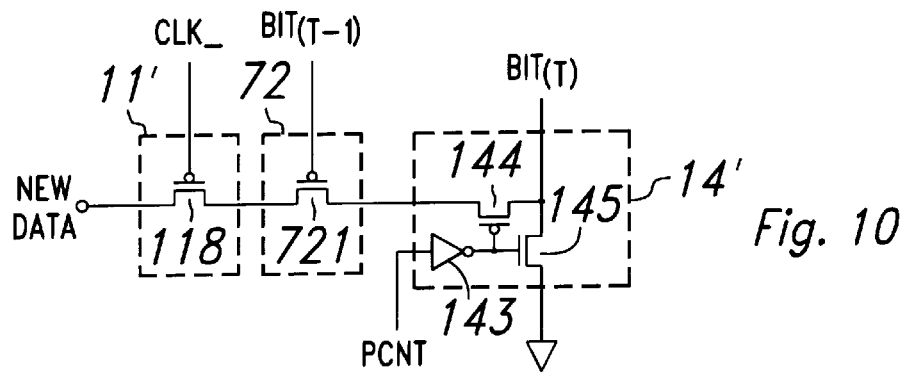
FIG. 10 is an implementation of an OR comparison according to the present invention.
Figure 11:
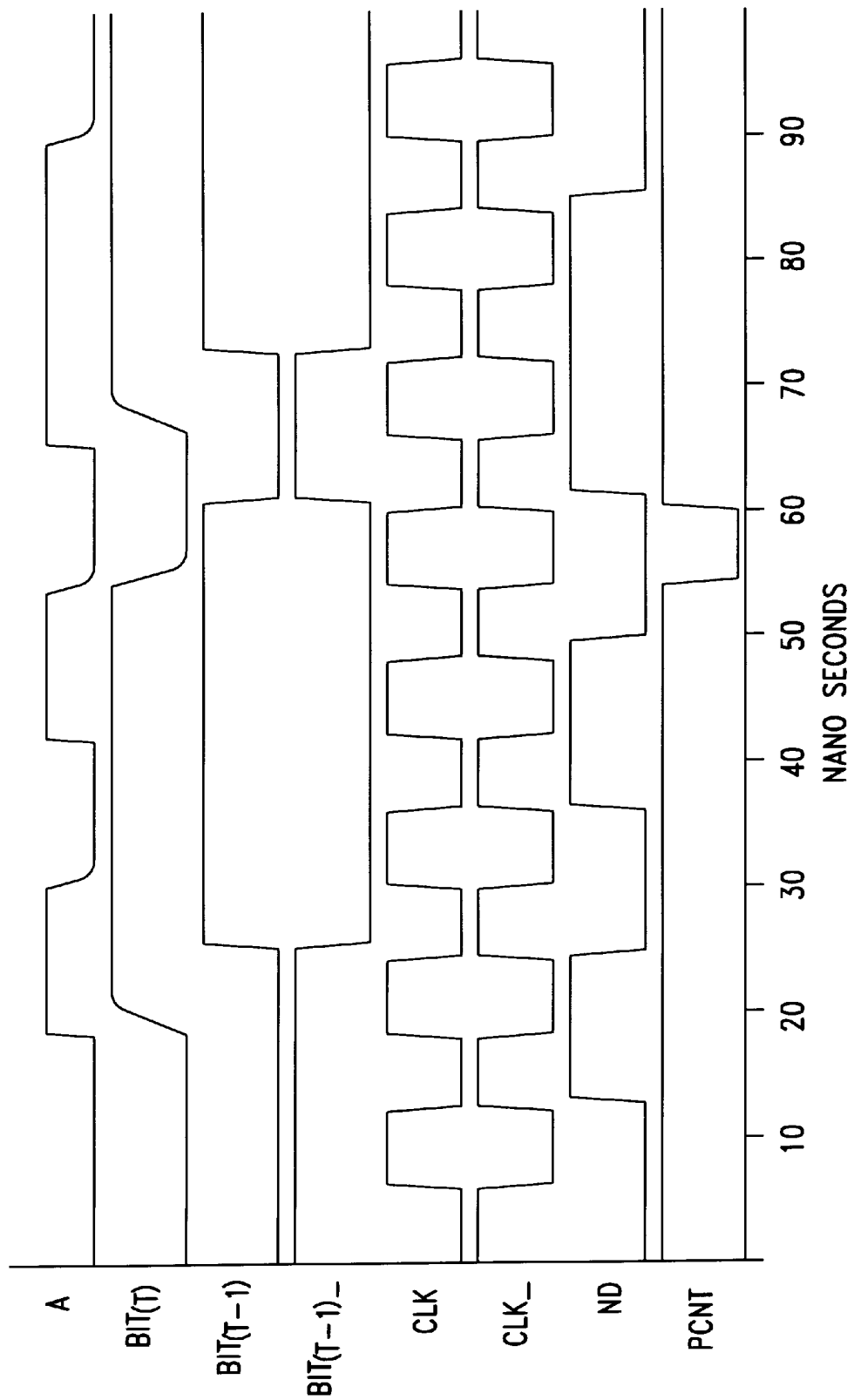
FIG. 11 is a timing diagram illustrating the relationship between selected voltages in the OR comparison circuit of FIG. 10 (and FIG. 3).

Referring to FIG. 10, an implementation of an OR gate according to the present invention is shown. The OR gate has a signal from the pass gate 11' applied to a first source-drain terminal of p-channel field effect transistor 721. The gate terminal of transistor 721 has the B(T-1) signal applied thereto. The second source-drain terminal of transistor 721 provides the signal for the initialization circuit 14'. The pass gate 11' for the AND gate has a different implementation as compared to the pass gate 11 for the exclusive OR circuit of FIG. 3. The pass gate circuit 11' of FIG. 10 is an p-channel field effect transistor 118 having the NEW DATA signal applied to a first source-drain terminal, providing a signal to the OR gate 72 by the second source-drain terminal of transistor 118, and having a CLK_ signal applied to the gate terminal of transistor 118. Similarly, the initialization circuit 14' required for this implementation of the OR gate is different from the implementation of the initialization circuit for the exclusive OR gate of FIG. 3. In the implementation of the initialization circuit 14' of FIG. 10, the output signal from OR gate 72 is applied to a first source drain terminal of p-channel field effect transistor 144. The second source-drain terminal of transistor 144 is coupled to a first source drain terminal of n-channel field effect transistor 145 and is coupled to the B(T) terminal. The PCNT signal is applied to the input terminal of inverting amplifier 143. The output terminal of inverting amplifier 143 is coupled to a gate terminal of transistor 144 and to the gate terminal of transistor 145. The second source-drain terminal of transistor 145 is coupled to a ground. The relationship of various signals for the OR gate comparison circuit is shown as a function of time in FIG. 11.

Figure 12:
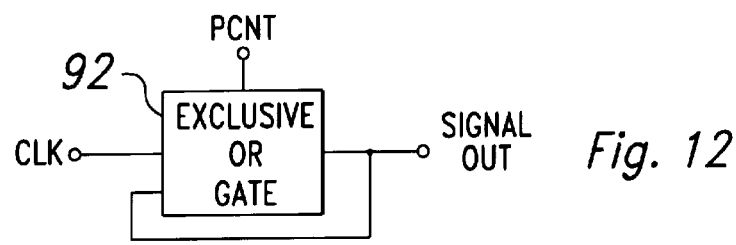
FIG. 12 illustrates the technique of the present invention is implementing a divide-by-two circuit.

Referring to FIG. 12, a divide-by-two counter is shown. A clock signal is applied to an input terminal of exclusive OR gate 92 while the PCNT signal is applied to a second input terminal of exclusive Or gate 92. The output signal of exclusive OR gate 92 is coupled to a third input terminal.

2. Operation of the Preferred Embodiment(s)

The present invention describes a technique for reducing the number of transistors in required to implement individual gates or components. The following Table 1 describes the number of transistors implementing selected gates or components according to the present invention.

TABLE 1

| GATE | Number of Transistors |
|---|---|
| exclusive OR logic gate | 2 |
| exclusive NOR logic gate | 2 |
| AND gate | 1 |
| OR gate | 1 |

In addition, circuits associated with the comparison gates registers can require a lesser number of transistors according to the present invention.

Referring to FIG. 4, the truth table for the exclusive OR comparison circuit for serial data signals is shown in Table 2. The circuit can be summarized as changing the stored B(T-1) only when the NEW DATA signal, ND is a logic 1. Of particular interest, when ND=0 and B(T-1)=1, the circuit is placed in a tristate mode whereby B(T)=B(T-1)=1. When ND=0 and B(T-1)=0,

TABLE 2

| ND | B(T-1) | B(T) |
|---|---|---|
| 0 | | 0 -> 0 |
| 0 | 1 -> | 1 |
| 1 | 0 -> | 1 |
| 1 | 1 -> | 0 | then p-channel transistor fails to conduct because the B(T) line is held at zero in the inactive cycle by the register. Therefore, with the gate, source, and drain at 0 v, the p-channel transistor cannot begin to conduct in the active cycle and B(T) remains at a logic 0.

Referring to FIG. 6 and the exclusive NOR gate comparison circuit, the truth table for the operation of the circuit is found in Table 3. As with the exclusive OR circuit,

TABLE 3

| ND | B(T-1) | B(T) |
|---|---|---|
| 0 | 0 -> 1 | |
| 0 | 1 -> 0 | |
| 1 | 0 -> 0 | |
| 1 | 1 -> 1 | | during the initialization of the comparison circuit, the first NEW DATA signal, ND, is stored in the register.

Referring to the AND circuit of FIG. 8, the truth table for this comparison circuit is shown in Table 4. As indicated in in the FIG. 8, this comparison gate can be implemented with a single transistor.

TABLE 4

| ND | B(T-1) | B(T) |
|---|---|---|
| 0 | 0 | 0 |
| 0 | 1 | 0 |
| 1 | 0 | 0 |
| 1 | 1 | 1 |

Referring to the OR circuit of FIG. 10, the truth table for this comparison circuit is shown in Table 5. As indicated in in the FIG. 10, this comparison gate can be implemented with a single transistor.

TABLE 5

| ND | B(T-1) | B(T) |
|---|---|---|
| 0 | 0 | 0 |
| 0 | 1 | 1 |
| 1 | 0 | 1 |
| 1 | 1 | 1 |

Referring to FIG. 12, the truth table for his circuit is shown in Table 6. The PCNT signal is used to initialize the output signal to 0. From Table 6, an output signa is obtained which is half the frequency of the input clock signal.

TABLE 6

| | CLK | OUTPUT |
|---|---|---|
| 0 | 0 | |
| 1 | 1 | |
| 0 | 1 | |
| | 1 | 0 |
| | 0 | 0 |

As will be clear to those skilled in the art, adding units and parity checkers for serial data are a few other examples of how this technique can be effectively used.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. For example, while the parity generating unit is implemented in exclusive NOR logic gates, this unit can equally as well be implemented with other logic components, such as with exclusive OR logic gates. It is accordingly intended that the claims shall cover all modifications and applications as do not depart from the spirit and scope of the invention.

What is claimed is:

1. An integrated circuit for comparing serial data with an exclusive OR function, said circuit comprising:
    a register for storing a cumulative data bit; and
    an exclusive OR gate providing a output data bit in which an exclusive OR function has been performed on a new data bit and on a cumulative data bit, said output data bit being stored in said register to provide an updated cumulative data bit, wherein said exclusive OR gate consists of two transistors.

2. The circuit of claim 1 wherein said exclusive OR gate includes a first and a second transistor, a source drain terminal of said first transistor and a gate terminal of said second transistor have a new data signal applied thereto, said first transistor having a said cumulative data bit applied thereto, said second transistor having a complement of said cumulative data bit applied thereto.

3. The circuit of claim 1 wherein said register includes:
    a bit register;
    a pass gate having said new data bit applied thereto, said pass gate transmitting said new data bit in response to a clock signal; and an initialization circuit, said initialization circuit resulting in the storage of a first sequential new data bit in said bit register.

4. An integrated circuit for comparing serial data with an AND function, said circuit comprising:

a register for storing a cumulative data bit; and an AND gate providing a output data bit in which an AND has been performed on a new data bit and a cumulative data bit, said output data bit being stored in said register to provide an updated cumulative data bit, wherein said AND gate consists of one transistor.

5. The circuit of claim 4 wherein said AND gate transistor has a first source-drain terminal having a new data signal applied thereto and a gate terminal having said cumulative data bit applied thereto.

6. The circuit of claim 4 wherein said register includes:

a pass gate having said new data bit applied thereto, said pass gate transmitting said new data bit in response to a clock signal; and an initialization circuit, said initialization circuit providing a storage of a first sequential new data bit in said register.

7. A circuit for performing a comparison operation on a series of data bits, said circuit comprising:

a pass gate for transmitting a new data signal in response to a clock signal;

a register for storing a cumulated data signal;

a logic gate for performing said comparison operation on said cumulated data signal and said new data signal to provide a new cumulated data signal, said new cumulated data signal being replacing said cumulated data signal in said register;

an initialization circuit for determining a first cumulated data signal to be stored in said register; and wherein said comparison operation is an exclusive OR function, and said logic gated consists of two transistors.

8. The circuit of claim 7 wherein said logic gate is responsive to a cumulative data signal and a complement of said cumulative data signal to perform said comparison operation.

9. A circuit for performing a comparison operation on a series of data bits, said circuit comprising:

a pass gate for transmitting a new data signal in response to a clock signal;

a register for storing a cumulated data signal;

a logic gate for performing said comparison operation on said cumulated data signal and said new data signal to provide a new cumulated data signal, said new cumulated data signal being replacing said cumulated data signal in said register; and wherein said comparison operation is an AND function, said logic gate consisting of one transistor.

10. A circuit for performing a comparison operation on a series of data bits, said circuit comprising:

a pass gate for transmitting a new data signal in response to a clock signal;

a register for storing a cumulated data signal;

a logic gate for performing said comparison operation on said cumulated data signal and said new data signal to provide a new cumulated data signal, said new cumulated data signal being replacing said cumulated data signal in said register; and wherein said comparison operation is and OR function, said logic gate consisting of one transistor.

11. An integrated circuit for comparing serial data with an OR function, said circuit comprising:

a register for storing a cumulative data bit; and an OR gate providing a output data bit in which an OR function has been performed on a new data bit and a cumulative data bit, said output data bit being stored in said register to provide an updated cumulative data bit, wherein OR gate consists of one transistors.

12. The circuit of claim 11 wherein said OR gate transistor has a first source-drain terminal with a new data signal applied thereto and a gate terminal with said cumulative data bit applied thereto.

13. The circuit of claim 11 wherein said register includes:

a bit register;

a pass gate having said new data bit applied thereto, said pass gate transmitting a new data bit in response to a clock signal; and an initialization circuit, said initialization circuit providing a storage of a first sequential new data bit in said bit register.

* * * * *